(12) United States Patent  (10) Patent No.: US 7,897,301 B2
Deguchi  (45) Date of Patent: Mar. 1, 2011

(54) FINE PATTERN FORMING METHOD AND STAMPER

(75) Inventor: Kyosuke Deguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 350 days.

(21) Appl. No.: 12/137,853

(22) Filed: Jun. 12, 2008

(65) Prior Publication Data

US 2009/0017266 A1    Jan. 15, 2009

(30) Foreign Application Priority Data

Jul. 12, 2007    (JP) .............................. 2007-183200

(51) Int. Cl.
  *G03F 1/00*    (2006.01)
(52) U.S. Cl. .......................................... 430/5; 430/394
(58) Field of Classification Search ...................... 430/5, 430/311, 394; 427/125, 162
See application file for complete search history.

(56) References Cited

U.S. PATENT DOCUMENTS

2005/0226999 A1* 10/2005 Kouchiyama et al. ....... 427/162

2007/0037092 A1  2/2007 Konishi et al.

FOREIGN PATENT DOCUMENTS

JP    2005-203052 A    7/2005
JP    2007-72374 A    3/2007

* cited by examiner

*Primary Examiner*—Stephen Rosasco
*Assistant Examiner*—Rashid Alam
(74) *Attorney, Agent, or Firm*—Fitzpatrick, Cella, Harper & Scinto

(57) ABSTRACT

A technique for forming fine patterns by a simple method. A fine pattern forming method includes a step of forming a heat-resist film on a substrate, applying energy to regions of the resist film to form a fine pattern, and thereafter developing the resist film. The material used to form the resist film is a metal oxide of a composition that differs from a stoichiometric composition by lacking a small amount of oxygen, the energy is applied to the resist film using pressure, and the resist film is developed using an alkaline developer.

5 Claims, 2 Drawing Sheets

FINE PATTERN FORMING METHOD AND STAMPER

BACKGROUND OF THE INVENTION

1. Field of the Invention

The present invention relates to a fine pattern forming method and a stamper.

2. Description of the Related Art

In the manufacture of semiconductors and optical recording media, a plurality of substrates having a same pattern are produced by forming a pattern on a plurality of substrates, or by transferring a pattern formed on a substrate to other substrates.

To form the pattern on the substrate, a method called photolithography is commonly used in the manufacture of semiconductors. In photolithography, a light-sensitive photoresist is used, and a pattern formed in a mask is transferred to the substrate.

The manufacture of optical recording media, however, is generally performed by forming a first mold using photolithography and subsequently plating the first mold to form a stamper. The stamper is then used for injection molding.

The patterns used in the manufacture of optical recording media have become finer in recent years. To this end, Japanese Patent Application Laid-Open No. 2005-203052 discloses a technique in which a metal oxide compound of a composition that differs from a stoichiometric composition by lacking a small amount of oxygen, known as a heat resist, is used in place of a photoresist.

Japanese Patent Application Laid-Open No. 2007-72374 discloses a nanoimprint method in which a photoresist is used, a formed substrate is used as a mold, and a pattern of the mold is transferred onto the photoresist formed on the substrate.

In conventional pattern manufacturing methods: 1) a mask, an exposure apparatus, a dry etching apparatus, and the like are required when photolithography is used; and 2) an exposure apparatus is required when a heat-resist is used.

Even when the nanoimprint method is used, the substrate having the pattern formed thereon, which forms the mold, has to be manufactured using photolithography. In the nanoimprint method, the pattern to be transferred to the substrate is first transferred to a photoresist. With the photoresist onto which the pattern has been transferred as a mask, the pattern is transferred to the substrate using a dry etching method.

A simpler method for forming the fine pattern is therefore desired.

SUMMARY OF THE INVENTION

The present invention provides the following as a technique for forming a fine pattern by a simpler method. Specifically, the fine pattern forming method includes steps of: forming, on a substrate, a metal oxide film having a composition that differs from a stoichiometric composition by lacking a small amount of oxygen; applying a pressure to a region where a pattern of the metal oxide film is formed; and developing the metal oxide film using an alkaline developer.

Further features of the present invention will become apparent from the following description of exemplary embodiments with reference to the attached drawings.

DESCRIPTION OF THE EMBODIMENTS

The inventor conceived of the invention upon discovering that an etching speed of a metal oxide of a composition that differs from a stoichiometric composition by lacking a small amount of oxygen (hereinafter referred to as an incomplete metal oxide) with an alkaline solution was changed by a pressure applied to a surface of the metal oxide.

The present invention relates to a fine pattern forming method, which includes the steps of: applying energy to a region where a desired pattern is to be formed in an incomplete oxide film on a substrate; and, thereafter, developing the resist film. The energy is applied to the resist film using pressure, and the resist film is developed using an alkaline developer.

The metal forming the incomplete oxide layer can be one of tungsten and molybdenum.

The application of pressure to the resist can be performed by pressing a fine pattern formed in a mold onto a surface of the resist film or by scanning a probe across the surface of the resist film.

The substrate including the fine pattern and formed using the-above described method can then be used as a stamper.

The pressure is applied to the predetermined locations at which a signal pattern is to be formed on the substrate.

The etching speed for the region to which the pressure has been applied is faster than the etching speed for regions to which the pressure has not been applied.

The applied pressure is determined according to the etching time and the depth to be formed. The upper limit of the pressure is not limited in any particular way. However, when the pressure is increased, a larger pressure applying apparatus is required. Also, under large pressures, the mold or the resist film may be damaged.

The following describes examples of the present invention in detail with reference to the drawings. The present invention is not limited to the examples and may include a variety of different forms within the technological scope of the invention.

FIRST EXAMPLE

A first example of the fine pattern forming method of the present invention is described below with reference to FIGS. 1A, 1B, 1C and 1D.

Figure 1A:
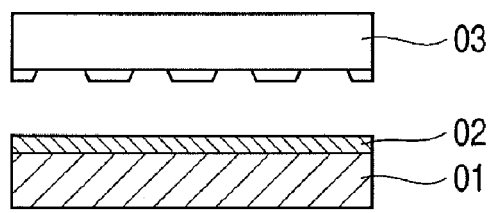
FIGS. 1A, 1B, 1C and 1D are diagrams illustrating a first example of a method for forming an indentation and protrusion pattern of the present invention.
Figure 1B:
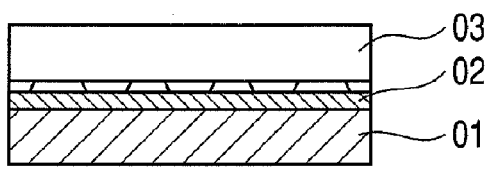

As shown in FIG. 1A, a substrate 01 having a pattern forming layer 02 formed thereon made up of the incomplete metal oxide was prepared using a sputtering method. Next, a mold 03 having a desired pattern formed thereon was arranged so that the pattern and the pattern forming layer 02 face each other. The substrate 01 was formed using glass. The mold 03 was formed using a glass substrate. The pattern was formed using a photolithography method and a dry-etching method on the surface of the glass.

Tungsten oxide of a composition that differs from the stoichiometric composition by lacking a small amount of oxygen was used as the incomplete metal oxide. Tungsten oxide was formed by sputtering a target including W in an atmosphere of Ar gas at a flow rate of 15 sccm and $O_2$ gas at a flow rate of 16 sccm at an input power of 400 W. By changing the ratio of the Ar gas and the $O_2$ gas, it is possible to adjust the composition. The film thickness can be adjusted using the sputtering time. In the present example, the film thickness was set to 200 nm.

The above-described tungsten oxide and the later-described molybdenum oxide are amorphous.

In the present example, 50 μm/50 μm lines and spaces were formed in the mold.

Next, pressure was applied to the pattern forming layer 02 formed on the substrate 01 by applying a pressure of 4 kN/cm² for 10 minutes to the surface opposing the surface of the mold 03 on which the pattern is formed. Since 50 μm/50 μm lines and spaces were formed in the mold, the pressure applied in regions of the pattern forming layer 02, which contact the mold pattern, is 8 kN/cm².

Figure 1C:
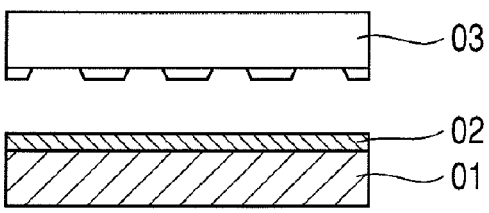

Thereafter, the mold 03 is removed as shown in FIG. 1C.

Figure 1D:

As shown in FIG. 1D, an indentation and protrusion pattern corresponding to the mold 03 was obtained by alkaline-developing the substrate 01 and the pattern forming layer 02. In the present example, a 0.5% aqueous solution of tetra-methyl ammonium hydroxide (hereinafter abbreviated to TMAH) was used as the developer at an application rate of 0.25 liters/minute. Thereafter, the substrate 01 and the pattern forming layer 2 were rinsed using pure water (not shown) and dried. Lines and spaces with a pitch of 100 μm were formed as the indentation and protrusion pattern corresponding to the mold. A groove depth in the structure manufactured in the above-described manner was measured using an AFM (Atomic Force Microscope) and was found to have been accurately controlled to 20 nm.

Any material with favorable surface accuracy and surface property can be used as the substrate 01 and the mold 03. Such materials include quartz glass and silicon wafer.

SECOND EXAMPLE

In the second example, the pattern was formed by a method similar to that in the first example, differing only in the material of the pattern forming layer 02 and in the pressure.

The pattern forming layer 02 was formed using molybdenum oxide of a composition that differs from the stoichiometric composition by lacking a small amount of oxygen. The forming method enables molybdenum oxide to be formed by sputtering a target including Mo in an atmosphere of Ar gas and $O_2$ gas. Moreover, by changing the ratio of the Ar gas and the $O_2$ gas, it is possible to adjust the composition. The film thickness can be adjusted using the sputtering time. In the present example, the film thickness was set to 100 nm, and a pressure of 1.5 kN/cm² was applied for 10 minutes. A developing time of 20 minutes was used. Since 50 μm/50 μm lines and spaces were formed in the mold, the pressure applied in regions of the pattern forming layer 02, which contact the mold pattern, was 10 kN/cm².

The developing was performed using the same conditions as in the first example.

It was found that the groove depth was accurately controlled to 10 nm.

THIRD EXAMPLE

Figure 2A:
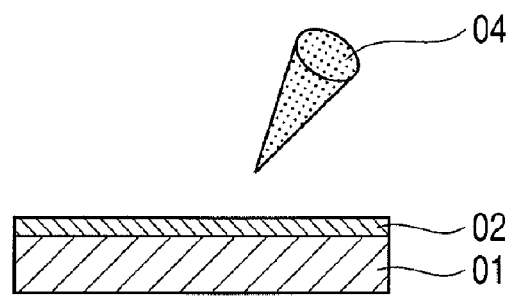
FIGS. 2A, 2B and 2C are diagrams illustrating a second example of a method for forming the indentation and protrusion pattern of the present invention.

A third example of the fine pattern forming method is described below with reference to FIGS. 2A, 2B and 2C.

Tungsten oxide was formed on a glass substrate as the pattern forming layer in the same way as in the first example. As shown in FIG. 2A, the pattern forming layer 02 on the substrate 01 faced a probe 04.

Figure 2B:
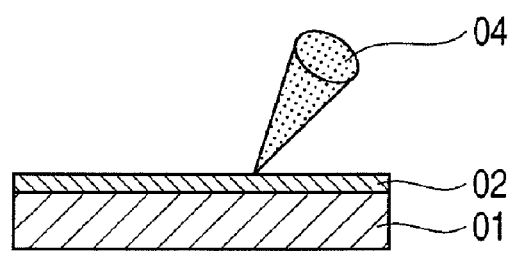

Next, as shown in FIG. 2B, the pattern forming layer 02 formed on the substrate 01 was scanned pressing the probe 04 to form 50 μm/50 μm lines and spaces. A scanning speed of 1 m/s and a pressure of 8 kN/cm² were used.

Figure 2C:

As shown in FIG. 2C, an indentation and protrusion pattern corresponding to the pattern scanned using the probe 04 was obtained by alkaline-developing the substrate 01 and the pattern forming layer 02 in the same way as in the first example. In the present example a 0.5% aqueous solution of TMAH was used as the developer at an application rate of 0.25 liters/minute. Thereafter, the substrate 01 and the pattern forming layer 02 were rinsed using pure water (not shown) and dried. A groove depth of the structure manufactured in the above-described manner was measured using the AFM and was found to have been accurately controlled to 20 nm.

Any material with favorable mechanical strength and abrasion resistance can be used as the substrate 01 and the probe 04. Such materials include quartz glass and silicon. Alternatively, an abrasion resistant film may be formed on the surface of a substrate, such as a glass, selected for mechanical strength.

FOURTH EXAMPLE

In the fourth example, a pattern identical to the pattern of the third example was formed on a substrate having a pattern forming layer 02 like that of the second example using the method described in the third example.

The pressure of the probe 04 was set to 10 kN/cm².

The developing time was set to 20 minutes and the groove depth was found to be accurately controlled to 10 nm.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-183200, filed Jul. 12, 2007, which is hereby incorporated by reference herein in its entirety.

What is claimed is:

1. A fine pattern forming method, comprising the steps of:
    forming, on a substrate, a metal oxide film having a composition that differs from a stoichiometric composition by lacking an amount of oxygen;
    applying pressure to the metal oxide film to form a predetermined pattern; and
    developing the metal oxide film using an alkaline developer after applying pressure to the metal oxide film.

2. The fine pattern forming method according to claim 1, wherein a metal in the metal oxide is one of tungsten and molybdenum.

3. The fine pattern forming method according to claim 1, wherein the pressure is applied by pressing a pattern formed in a mold onto a surface of the metal oxide film.

4. The fine pattern forming method according to claim 1, wherein the pressure is applied by scanning a probe across a surface of the metal oxide film.

5. A stamper including a fine pattern formed using the fine pattern forming method according to claim 1.

* * * * *